(12) United States Patent
Walser et al.

(10) Patent No.: US 8,902,406 B2
(45) Date of Patent: Dec. 2, 2014

(54) PROJECTION OBJECTIVE

(75) Inventors: Reinhold Walser, Otzberg Nieder-Klingen (DE); Thomas Schicketanz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 596 days.

(21) Appl. No.: 12/951,216

(22) Filed: Nov. 22, 2010

(65) Prior Publication Data

US 2011/0141446 A1 Jun. 16, 2011

(30) Foreign Application Priority Data

Nov. 26, 2009 (DE) .......................... 10 2009 047 179

(51) Int. Cl.
*G02B 17/06* (2006.01)
*G03F 7/20* (2006.01)

(52) U.S. Cl.
CPC ........ *G02B 17/0647* (2013.01); *G03F 7/70233* (2013.01); *G03F 7/70308* (2013.01); *G03F 7/70316* (2013.01)
USPC ................... 355/66; 355/51; 355/52; 355/53; 355/57; 355/60

(58) Field of Classification Search
CPC ............ G03F 7/70233; G03F 7/70225; G03F 7/70308; G03F 7/70316; G02B 17/0647
USPC ................. 355/49, 51, 52, 53, 55, 57, 60, 66, 355/67–71; 359/351, 861; 250/492.1, 250/492.2, 492.22, 493.1, 548
See application file for complete search history.

(56) References Cited

U.S. PATENT DOCUMENTS

| | | | |
|---|---|---|---|
| 4,545,646 A * | 10/1985 | Chern et al. ................ | 359/569 |
| 5,153,898 A | 10/1992 | Suzuki et al. | |
| 5,911,858 A | 6/1999 | Ruffner | |
| 5,973,826 A | 10/1999 | Chapman et al. | |
| 6,000,798 A | 12/1999 | Chipman et al. | |
| 6,014,252 A | 1/2000 | Shafer | |
| 6,226,346 B1 | 5/2001 | Hudyma | |

(Continued)

FOREIGN PATENT DOCUMENTS

| | | |
|---|---|---|
| EP | 1 281 011 | 2/2003 |
| EP | 1 282 011 | 2/2003 |

(Continued)

OTHER PUBLICATIONS

English translation of German Office Action for corresponding DE Appl No. 10 2009 047 179.0-51, dated Jan. 28, 2010.

(Continued)

*Primary Examiner* — Toan Ton
*Assistant Examiner* — Christina Riddle
(74) *Attorney, Agent, or Firm* — Fish & Richardson P.C.

(57) ABSTRACT

A projection objective, such as for EUV lithography, for imaging a pattern arranged in an object plane into an image plane with the aid of electromagnetic radiation from the extreme ultraviolet range is provided. The projection objective includes a plurality of mirrors provided with reflective coatings and arranged between the object plane and the image plane. At least one of the mirrors includes a graded reflective coating with a rotationally-asymmetric coating thickness profile in the mirror plane on a substrate with a rotationally-asymmetric or rotationally-symmetric surface profile. The projection objective can exhibit increased overall transmission.

28 Claims, 6 Drawing Sheets

(56) References Cited

U.S. PATENT DOCUMENTS

| | | |
|---|---|---|
| 6,262,826 B1 | 7/2001 | Shafer |
| 6,522,716 B1 | 2/2003 | Murakami et al. |
| 6,865,009 B2 * | 3/2005 | Nishioka ................ 359/295 |
| 6,927,901 B2 * | 8/2005 | Mann et al. .................. 359/366 |
| 7,414,781 B2 | 8/2008 | Mann et al. |
| 8,194,230 B2 | 6/2012 | Chan et al. |
| 8,279,404 B2 | 10/2012 | Chan et al. |
| 2002/0057421 A1 | 5/2002 | Kurematsu et al. |
| 2002/0129328 A1 | 9/2002 | Komatsuda |
| 2003/0081722 A1 * | 5/2003 | Kandaka et al. ............. 378/70 |
| 2003/0099034 A1 | 5/2003 | Mann et al. |
| 2004/0051857 A1 * | 3/2004 | Hudyma et al. ............. 355/67 |
| 2004/0070743 A1 * | 4/2004 | Hudyma et al. ............. 355/67 |
| 2006/0133569 A1 * | 6/2006 | Michaelsen et al. ............ 378/70 |
| 2007/0132977 A1 | 6/2007 | Komatsuda |
| 2007/0177274 A1 * | 8/2007 | Masaki et al. ............... 359/584 |
| 2008/0165415 A1 * | 7/2008 | Chan et al. ................. 359/351 |
| 2010/0195075 A1 | 8/2010 | Chan et al. |
| 2010/0265481 A1 * | 10/2010 | Mann et al. .................... 355/67 |
| 2013/0010352 A1 | 1/2013 | Chan et al. |

FOREIGN PATENT DOCUMENTS

| | | |
|---|---|---|
| EP | 1 930 771 A1 | 6/2008 |
| JP | 2006-059889 | 3/2006 |
| WO | WO 99/42902 A2 | 8/1999 |
| WO | WO 99/42905 A1 | 8/1999 |
| WO | WO 01/88597 | 11/2001 |
| WO | WO 02/073064 | 9/2002 |
| WO | WO 2005/098487 | 10/2005 |
| WO | WO 2005/119369 | 12/2005 |
| WO | WO 2007/031271 | 3/2007 |
| WO | WO 2009/024164 | 2/2009 |

OTHER PUBLICATIONS

Yulin et al., "EUV/Soft X-Ray Multilayer Optics," Proceedings of SPIE vol. 5645, pp. 289-298, (2005).

Bal, Matthieu Frédéric, dissertation "Next-Generation Extreme Ultraviolet Lithographic Projection Systems", pp. 1-139, (Feb. 10, 2003).

Machine translation of JP 2006-059889, published Mar. 2, 2006.

\* cited by examiner
PROJECTION OBJECTIVE

CROSS-REFERENCE TO RELATED APPLICATION

This application claims benefit under 35 U.S.C. §119 to German patent application serial 10 2009 047 179.0-51, filed Nov. 26, 2009, the entire contents of which are incorporated by reference herein.

FIELD

The disclosure relates to a projection objective for imaging a pattern disposed in an object plane into an image plane with the aid of electromagnetic radiation from the extreme ultraviolet (EUV) range, wherein a plurality of imaging mirrors provided with reflective coatings are arranged between the object plane and the image plane, and at least one of the mirrors is provided with a graded reflective coating.

BACKGROUND

The production of increasingly finer structures with the aid of lithographic methods in the manufacture of semiconductor components often involves light having an increasingly short wavelength. If light in the extreme ultraviolet (EUV) wavelength range is used, e.g. at wavelengths of between about 5 nm and 20 nm, it is generally no longer possible to use lens-type elements in a transmission mode, but rather illumination and projection objectives constructed of mirror elements each having reflective coatings adapted to the respective working wavelength are used. In contrast to mirrors in the visible and ultraviolet wavelength ranges, theoretically only a maximum reflectivity of less than 80% can generally be achieved per mirror. Since EUV projective devices usually include a plurality of mirrors, it is desirable for each of them to have relatively high reflectivity to help ensure sufficiently high overall reflectivity.

U.S. Pat. No. 6,927,901 discloses an EUV projection objective that includes a plurality of imaging mirrors between the object plane and the image plane, which define an optical axis and include reflective coatings. At least one of the mirrors has a graded reflective coating with a coating thickness profile that is rotationally symmetrical with respect to a coating axis, wherein the coating axis is eccentrically arranged with respect to the optical axis in order to achieve higher overall transmission of the projection objective.

SUMMARY

The disclosure generally provides an approach for increasing the overall transmission of a projection objective for the extreme ultraviolet range.

In a first aspect, the disclosure generally provides a a projection objective for imaging a pattern arranged in an object plane into an image plane with the aid of electromagnetic radiation from the extreme ultraviolet (EUV) range, wherein a plurality of imaging mirrors provided with reflective coatings are arranged between the object plane and the image plane, and at least one of the mirrors includes a graded reflective coating with a rotationally-asymmetric coating thickness profile in the mirror plane on a substrate with a rotationally-asymmetric or rotationally-symmetric surface profile. The coating thickness profile describes the distribution over the mirror surface of constant values of the coating thickness.

Optical parameters such as transmission, telecentricity, Stokes parameters in the pupil and others are mainly influenced by the surface profile of mirrors used in a projection objective. In particular, mirrors to be used in the EUV range in essentially normal incidence include a coating on a substrate. Then, the optical parameters are mainly influenced by the surface profile of the substrate. It has been found that the optical parameters can be improved by providing a graded reflective coating with a rotationally-asymmetric coating thickness profile in the mirror plane on a substrate, in particular on a substrate with a rotationally-asymmetric surface profile. Rotationally-asymmetric or freeform surface profiles of mirrors for projection objectives for EUV microlithography are described, for example, in U.S. Pat. No. 7,414,781 B2.

The coating thickness profile d(x,y) in the mirror plane x-y can be $$d(x, y) = \sum_{i=0}^{n-1} \sum_{j=0}^{i} a_{\Sigma_{k=1}^{i} k+j+1} (x - b_1)^{i-j} (y - b_2)^j$$

with n the maximum degree of the polynomial and $$a_{\Sigma_{k=1}^{i} k+j+1},$$

b1, b2 coefficients.

These types of thickness profiles can be produced even from substrates with rotationally-asymmetric surface profile using conventional coating devices that usually provide rotationally-symmetric coatings.

Advantageously, the coefficient b is not equal to zero, which is equivalent to decentering the coating axis with respect to the mirror or substrate axis during the coating process. It is thus possible to reduce (minimize) the rotationally-asymmetry of the final coating thickness profile.

The surface profile O(x,y) in the mirror plane x-y can be $$O(x, y) = \sum_{i=0}^{n-1} \sum_{j=0}^{i} c_{\Sigma_{k=1}^{i} k+j+1} x^{i-j} y^j = c_1 + c_2 x + c_3 y + c_4 x^2 + \ldots$$

with n the maximum degree of the polynomial and $$d_{\Sigma_{k=1}^{i} k+j+1}$$

coefficients.

In some embodiments, the coating thickness profile as well as the surface profile are essentially hyperbolic. With respect to freeform mirrors, mirrors with essentially hyperbolic surface profile can be particularly advantageous. And it has been found, that essentially hyperbolic coating thickness profiles in the mirror plane in particular can be useful for adjusting and improving optical parameters such as transmission, telecentricity, Stokes parameters in the pupil and others of mirrors made by coating a substrate with an essentially hyperbolic surface profile.

In a second aspect, the disclosure generally provides a projection objective for imaging a pattern arranged in an object plane into an image plane with the aid of electromagnetic radiation from the extreme ultraviolet (EUV) range, wherein a plurality of imaging mirrors provided with reflective coatings is arranged between the object plane and the image plane, and at least one of the mirrors includes a graded reflective coating that has an elliptical, parabolic or hyperbolic coating thickness profile in the mirror plane. The coating thickness profile describes the distribution over the mirror surface of constant values of the coating thickness.

It has been found that EUV projection objectives which have at least one mirror with an elliptically, parabolically or hyperbolically graded reflective coating, that is having a coating thickness profile corresponding to a conical section, have a higher overall transmission compared to conventional EUV projection objectives in which all mirrors having a graded reflective coating have a centered, rotation-symmetrical coating thickness profile.

In certain embodiments, the mirrors of the projection objective define an optical axis of the projection objective, and the coating axis of the graded reflective coating with an elliptical, parabolic or hyperbolic coating thickness profile is eccentrically arranged with respect to the optical axis of the projection objective. These projection objectives having at least one mirror with a decentered elliptically, parabolically or hyperbolically graded reflective coating have a higher overall transmission than the hitherto known projection objectives having at least one mirror with a decentered rotation-symmetrical graded reflective coating.

The graded reflective coating can have an elliptical, parabolic or hyperbolic coating thickness profile of the coating thickness d in the x-y plane, that can be described as $$d(x, y) = c_1 + \begin{pmatrix} x - c_2 \\ y - c_3 \end{pmatrix}^T \begin{pmatrix} c_6 & c_7/2 \\ c_7/2 & c_8 \end{pmatrix} \begin{pmatrix} x - c_2 \\ y - c_3 \end{pmatrix}$$

wherein $c_1$, $c_2$, $c_3$, $c_6$, $c_7$, $c_8$ are coefficients. Coefficient $c_1$ is a background thickness, $c_2$ and $c_3$ are the amounts of decentering in the x and y directions. The real parameters $c_6$, $c_7$, $c_8$, which can be larger or smaller than zero, describe the three types of cone section: ellipse, parabola and hyperbola. Such a coating thickness profile in the manner of a cone section already results in an increase in overall transmission and, at the same time, from a process-technological point of view, is not too complex to achieve when coating each mirror.

In some embodiments, the mirrors are formed in such a manner and arranged relative to each other in such a way that each mirror can be irradiated from an incident angle range characteristic for the mirror, wherein at least the mirror having the largest incident angle range includes a graded reflective coating having an elliptic, parabolic or hyperbolic coating thickness profile. It has been found, in particular, that for mirrors having a great range of incidence, the elliptical, parabolic or hyperbolic coating thickness profile of the reflective coating results in a substantial increase in reflectivity, which has a positive effect on the overall transmission of the projection objective.

Advantageously, more than five mirrors are provided between the object plane and the image plane.

In some embodiments, all mirrors are arranged to be coaxial with respect to each other.

In certain embodiments, the mirrors are formed and arranged in such a manner that an intermediate image is created between the object plane and the image plane.

The above and further features can be derived from the claims and also from the description and the drawings, wherein each of the individual features can be realized either alone or as a plurality, in the form of sub-combinations, in an embodiment of the disclosure and also in other fields, and can thus be advantageous embodiments as such worthy of protection.

BRIEF DESCRIPTION OF THE DRAWINGS

The disclosure will be explained in more detail with reference to a preferred exemplary embodiment, wherein.

DETAILED DESCRIPTION

Figure 1:
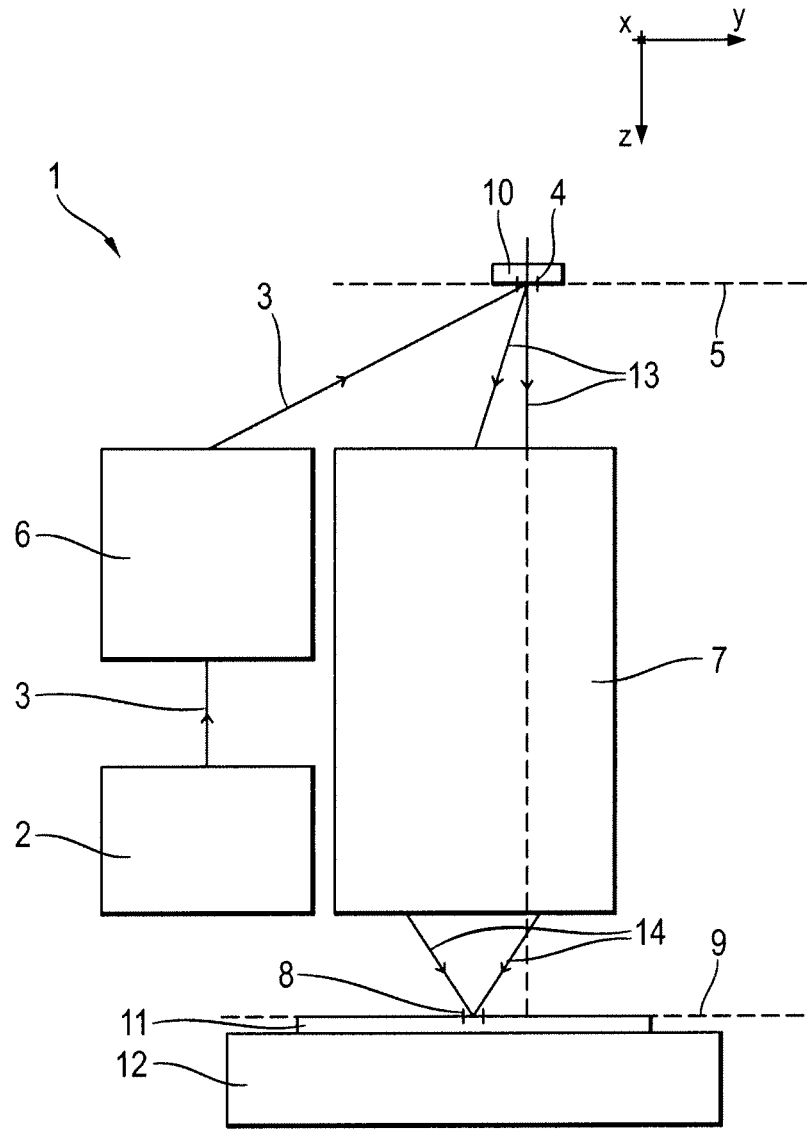
FIG. 1 schematically shows a projection illumination system for EUV microlithography.

A projection illumination system 1 for microlithography, as shown in FIG. 1 in an exemplary manner, has a light source 2 for illuminating light or imaging light 3. Light source 2 is an EUV light source emitting light in a wavelength range between, for example, 5 nm and 30 nm, in particular between 5 nm and 15 nm. Light source 2 can be, in particular, a light source having a wavelength of 6.9 nm or a light source having a central wavelength of 13.5 nm. Other EUV wavelengths are also possible. Generally, any desired wavelengths, such as visible wavelengths or even other wavelengths, which can be used in microlithography and for which suitable laser light sources and/or LED light sources (for example 365 nm, 248 nm, 193 nm, 157 nm, 129 nm, 109 nm) are available, are possible for illumination light 3 guided by projection illumination system 1. A beam path of illumination light 3 is shown in FIG. 1 in an extremely schematic manner.

An illumination optics 6 is used to guide illumination light 3 from light source 2 to an object field 4 in an object plane 5. Object field 4 is imaged into an image field 8 in an image plane 9 at a predetermined reduction ratio with the aid of a projection objective or imaging optics 7. Image field 8 has an extension of 13 mm in the x direction and an extension of 1 mm in the y direction. The exemplary embodiment shown in FIG. 2 can be used for projection optics 7. Projection optics 7 depicted in FIG. 2 has a reduction ratio of 8. Other reduction ratios are also possible, such as by a factor of 4 or a factor of 5 or others. A reduction ratio of factor 8 is particularly suitable for illumination light 3 with an EUV wavelength, since an object-side incident angle on a reflection mask 10 can be kept small. An imaging reduction ratio of factor 8 also avoids having to use unnecessarily large masks. Image plane 9 is parallel to object plane 5 in projection optics 7 in the embodiment according to FIG. 2. A section of reflection mask 10 coinciding with object field 4, also referred to as a reticle, is imaged here.

Figure 2:
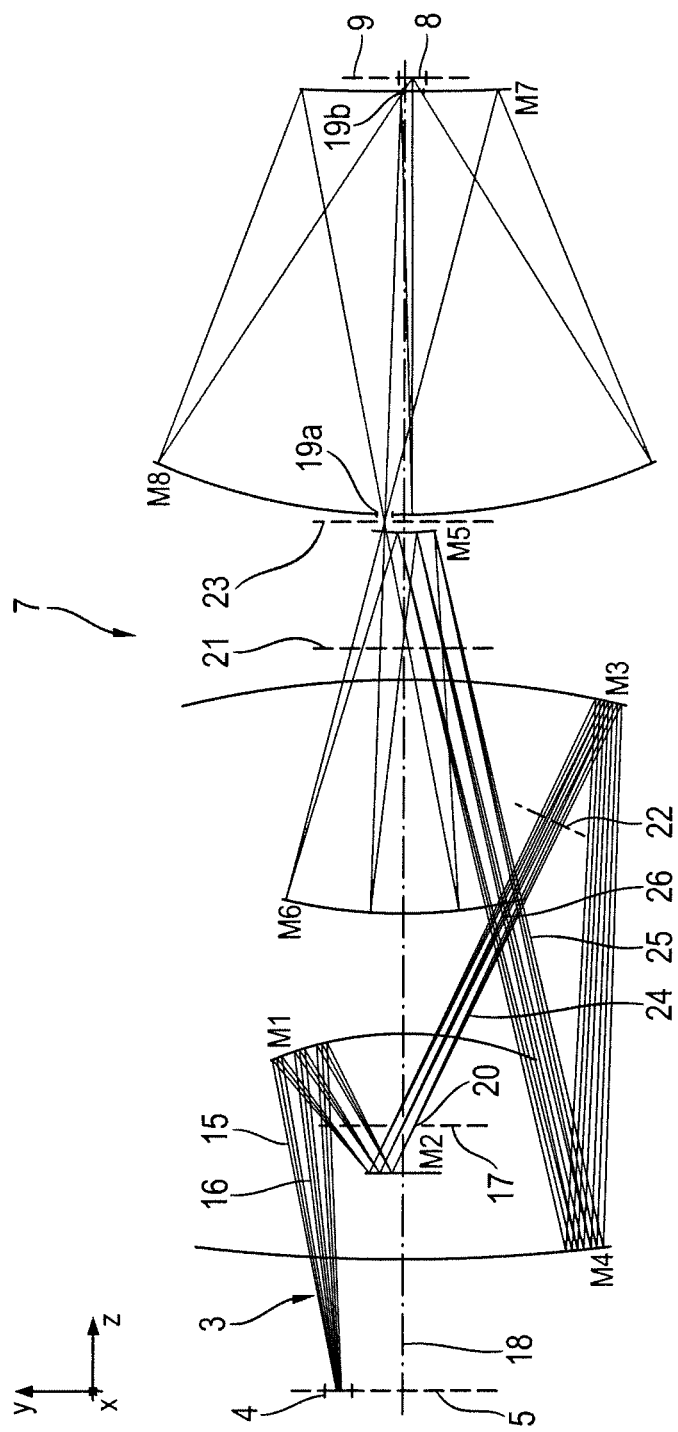
FIG. 2 shows an embodiment of an imaging optics useable as a projection objective in the projection illumination system according to FIG. 1, wherein the imaging beam path for the main beams (virtually) and for the top and bottom coma beam is shown for three selected field points.

Projection optics 7 images onto the surface of a substrate 11 in the form of a wafer which is supported by a substrate holder 12. FIG. 1 schematically shows, between reticle 10 and projection optics 7, a light beam 13 of illumination light 3 entering into the latter, and, between projection optics 7 and substrate 11, a light beam 14 of illumination light 3 exiting from projection optics 7. An image-field-side numeric aperture of projection optics 7 in the embodiment according to FIG. 2 is 0.50. This is not shown to scale in FIG. 1.

To simplify the description of the projection illumination system 1 and the various embodiments of projection optics 7, a Cartesian x y z coordinate system is indicated in the drawing from which the positional relationship of each of the components shown in the figures can be derived. In FIG. 1, the x direction is normal to the drawing plane. The y direction extends toward the right and the z direction towards the bottom.

Projection illumination system 1 is of the scanner type. Both reticle 10 and substrate 11 are scanned in the y direction during operation of projection illumination system 1. A stepper type of projection illumination system 1, wherein a stepwise displacement of reticle 10 and substrate 11 is carried out in the y direction between individual exposures of substrate 11, is also possible.

FIG. 2 shows the optical design of a first embodiment of projection optics 7. The beam path of three individual beams 15, originating from five object field points spaced with respect to each other in the y direction in FIG. 2, is shown in FIG. 2. The three individual beams 15 belonging to one of these five object field points are associated with three different illumination directions for the two object field points, respectively. Main beams 16 extending through the center of a pupil in a pupil plane 17 of projection optics 7 are shown in FIG. 2 only for reasons of clarity, since, due to the central pupil obscuration, they are not real but only virtual imaging beam paths of projection optics 7.

Projection optics 7 according to FIG. 2 has a total of eight mirrors, numbered M1 to M8 in sequence, following the beam path of individual beams 15, starting from object field 4. FIG. 2 shows the calculated reflection surfaces of mirrors M1 to M8. Only a small area of these calculated reflection surfaces is used as can be derived from FIG. 2. Only the area of the reflection surfaces that is actually used is actually present in real mirrors M1 to M8. These useable reflection surfaces are supported by mirror bodies in well known manner. Mirrors M1 to M8 define a common optical axis 18.

The optical data of projection optics 7 are shown in the following with reference to table 1a. Table 1a, in the column labeled "Radius", shows each radius of curvature of mirrors M1 to M8. The column labeled "Thickness" describes the distance to each subsequent surface in the z direction from object plane 5.

TABLE 1a

| Surface | Radius | Thickness |
| --- | --- | --- |
| Object plane | INFINITY | 543.757 |
| M1 | −449.236 | −211.269 |
| M2 | −381.481 | 71.127 |
| Aperture stop | INFINITY | 678.094 |
| M3 | −1293.655 | 878.647 |
| M4 | 2575.518 | 1103.024 |
| M5 | 340.443 | 577.829 |
| M6 | 659.115 | 1250.269 |
| M7 | 2394.266 | 642.054 |
| M8 | 817.414 | 663.527 |
| Image plane | INFINITY | 0.000 |

Table 1b describes the precise surface form of the reflective surfaces of mirrors M1 to M8, wherein constants K and A to G are to be substituted in the following equation for the arrow height z:

$$z(h) = \frac{ch^2}{1 + SQRT\{1 - (1+K)c^2h^2\}} + Ah^4 + Bh^6 + Ch^8 + Dh^{10} + Eh^{12} + Fh^{14} + Gh^{16}$$

wherein h is the distance to an optical axis 18 of projection optics 7. Thus $h^2 = x^2 + y^2$ applies. The reciprocal of "Radius" is substituted for c. In other words, table 1b summarizes the development parameters of arrow height z(h) of the mirror surfaces.

TABLE 1b

| Surface | K | A | B | C |
| --- | --- | --- | --- | --- |
| M1 | 0.000000E+00 | −2.460293E−10 | −1.269784E−15 | 2.803303E−21 |
| M2 | 0.000000E+00 | 6.386979E−08 | −2.318025E−12 | 6.696092E−17 |
| M3 | 0.000000E+00 | 9.799571E−11 | −1.514496E−15 | 1.015677E−20 |
| M4 | 0.000000E+00 | −1.251897E−11 | −1.029828E−15 | 6.301813E−21 |
| M5 | 0.000000E+00 | 2.958312E−08 | 5.028056E−13 | 8.066658E−18 |
| M6 | 0.000000E+00 | 2.017168E−11 | −2.275527E−17 | −9.166209E−23 |
| M7 | 0.000000E+00 | 1.252401E−09 | 4.102615E−15 | 2.060274E−20 |
| M8 | 0.000000E+00 | 2.416984E−11 | 5.199686E−17 | 8.459189E−23 |

| Surface | D | E | F | G |
| --- | --- | --- | --- | --- |
| M1 | 1.652701E−25 | 0.000000E+00 | 0.000000E+00 | 0.000000E+00 |
| M2 | −4.001704E−21 | 0.000000E+00 | 0.000000E+00 | 0.000000E+00 |
| M3 | −2.679237E−26 | 0.000000E+00 | 0.000000E+00 | 0.000000E+00 |
| M4 | −1.577707E−26 | 0.000000E+00 | 0.000000E+00 | 0.000000E+00 |
| M5 | −4.143857E−21 | 0.000000E+00 | 0.000000E+00 | 0.000000E+00 |
| M6 | 5.861325E−28 | 0.000000E+00 | 0.000000E+00 | 0.000000E+00 |

TABLE 1b-continued

| | | | | |
|---|---|---|---|---|
| M7 | 1.022964E−25 | 1.423250E−30 | 0.000000E+00 | 0.000000E+00 |
| M8 | 1.424018E−28 | 1.255450E−34 | 7.241285E−40 | 0.000000E+00 |

Object field 4 and image field 8 are arranged around optical axis 18 in the manner of ring segments. Mirrors M1 to M4 are used in an approximate ring-segment manner and off-axis with respect to optical axis 18. The utilized optical reflection surface of mirrors M1 to M4 is thus remote from optical axis 18. Object field 4 and image field 8 are arranged in a spaced relationship to optical axis 18.

Mirrors M1, M3, M4, M6 and M8 have a concave mirror configuration. Mirrors M2, M5 and M7 have a convex mirror configuration.

Mirrors M1 and M6, and M5 and M8 are in a back-to-back configuration as far as the orientation of their reflective surfaces is concerned.

The optically utilized areas of mirrors M1 to M6 have no through-passage for passing imaging light, are thus not obscured.

Individual beams 15 pass through a through-passage 19a in mirror M8 in the imaging beam path between mirrors M6 and M7. Mirror M8 is utilized around through-passage 19. Mirror M8 is thus an obscured mirror. In addition to mirror M8, mirror M7 is also obscured, which also has an almost central through-passage 19b. Through-passage 19b of mirror M7 is passed through by imaging light 3 in the imaging beam path between mirror M8 and image field 8 shortly before reaching image field 8.

In the example shown, pupil plane 17 is between mirrors M2 and M3, in the imaging beam path in projection optics 7. Pupil plane 17, in the imaging beam path, is between object field 4 and through-passage 19 of mirror M8. An obscuration stop 20 is arranged in the pupil plane 17. Obscuration stop 20 shields that central area of imaging light 3 in pupil plane 17 which does not contribute to imaging object field 4 due to through-passages 19.

In the imaging beam path, between mirrors M2 and M3, downstream of pupil plane 17, a first intermediate image plane 22 of projection optics 7 is present. A second intermediate image plane 23 is between the second pupil plane 21 and the exit pupil of the projection optics 7 in the imaging beam path between mirrors M6 and M7.

A first imaging partial beam 24 extends between mirrors M2 and M3 within projection optics 7. A second imaging partial beam 25 extends between mirrors M4 and M5. These two imaging partial beams 24, 25 cross in a crossing area 26. This crossing area 26 is spatially adjacent to mirror M6.

Projection optics 7 is a catoptric-type optics, that is an optics composed only of mirrors M1 to M8.

In the example shown in FIG. 2, all mirrors M1 to M8 have a decentered graded reflective coating with an elliptic coating thickness profile of layer thickness d in the x-y-plane, i.e. essentially the plane of the respective mirror. Mirrors with a graded reflective coating could also be used, which have a hyperbolic or parabolic coating thickness profile, or mirrors with different coating thickness profiles could be combined with each other. The elliptic coating thickness profile can be described, on the basis of the above mentioned general quadratic form of the coating thickness profile, by $d(x,y)=c_1+c_6 x^2+c_7 x(y-c_3)+c_8(y-c_3)^2$, wherein $c_1, c_3, c_6, c_7, c_8$ are coefficients. In the present example, decentering is only in the y direction, so that $c_2$ of the general formula is equal to zero. This can be the case, for example, with a mirror-symmetrical beam path. The values for the coefficients $c_1, c_3, c_6, c_7, c_8$, i.e. the development coefficients of generally decentered conical-section-type layers for the special case of elliptic distribution, are indicated in table 2 for each mirror M1 to M8.

TABLE 2

| | c1 | c3 | c6 | c7 | c8 |
|---|---|---|---|---|---|
| M1 | 1.01E+00 | −1.19E+02 | 5.36E−08 | −4.50E−12 | 4.01E−08 |
| M2 | 1.06E+00 | −5.57E+01 | 1.14E−05 | 6.62E−09 | 7.02E−06 |
| M3 | 1.02E+00 | 2.26E−05 | 1.16E−08 | −1.76E−12 | 1.08E−08 |
| M4 | 9.88.E−01 | −1.01E+02 | 2.02E−07 | 5.51E−11 | 2.69E−07 |
| M5 | 1.18E+00 | 1.65E+02 | −8.45E−06 | −1.09E−09 | −3.03E−06 |
| M6 | 1.01E+00 | −1.09E−05 | −9.27E−08 | −5.09E−10 | −1.65E−07 |
| M7 | 9.96E−01 | 4.30E+01 | 8.44E−07 | −1.12E−09 | 8.28E−07 |
| M8 | 1.01E+00 | 8.54E−06 | 1.22E−07 | −2.52E−10 | 1.26E−07 |

Figure 3:
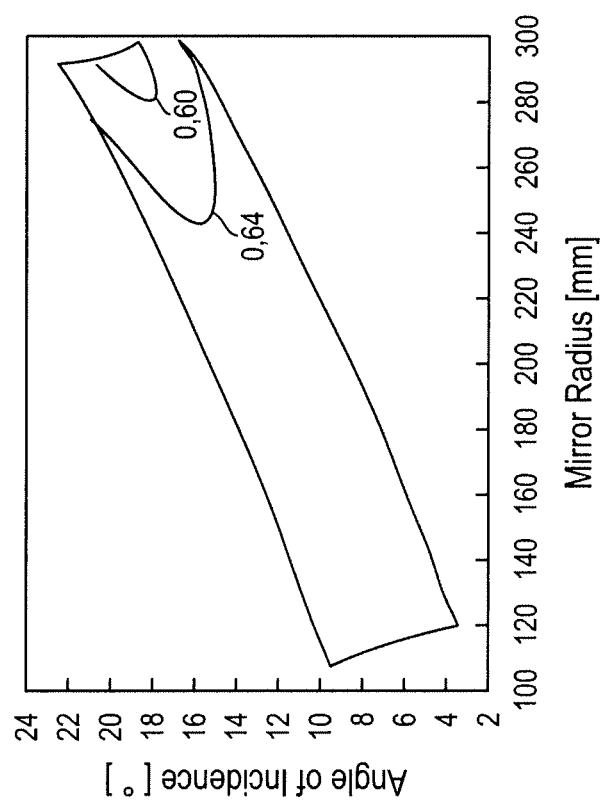
FIG. 3 shows the distribution of the radiation intensity as a function of the mirror radius and the incident angle for a mirror having a graded reflective coating including a decentered elliptic coating thickness profile.

To illustrate the positive effect of the elliptic layer thickness development of graded reflective coatings on the overall transmission of projection objectives, FIG. 3 shows the distribution of the radiation intensity as a function of the mirror radius and incident angle for a mirror with a graded reflective coating that has a decentered elliptical coating thickness profile. In this case it is the radiation intensity distribution on mirror M7 from the example shown in FIG. 2, wherein the mirror radius is varied. Across most incident angles and mirror radii, the intensity which is equivalent to the reflectivity, is markedly above 0.64. The intensity only falls below that if high incident angles coincide with very large mirror radii. With mirror radii of above 280 mm and incident angles around 18°, the intensity falls below 0.6. The maximum value of intensity is 0.7, the minimum value 0.56.

This can be compared to the intensity distribution of mirror M7 of a projection objective identical to the one shown in FIG. 2, with the only difference that all mirrors M1 to M8 have a graded reflective coating with a centered rotation-symmetrical coating thickness profile, which can also be described as $d(x,y)=c_1+c_6 x^2+c_7 x(y-c_3)+c_8(y-c_3)^2$, wherein the coefficients $c_3$ and $c_7$ are always equal to zero, and $c_6=c_8$. The values for the coefficients $c_1, c_3, c_6, c_7, c_8$, i.e. the development coefficients of a centered, rotation-symmetrical coating, are indicated in FIG. 3 for each mirror M1 to M8.

TABLE 3

| | c1 | c3 | c6 | c7 | c8 |
|---|---|---|---|---|---|
| M1 | 1.01E+00 | 0.00E+00 | 5.66E−08 | 0.00E+00 | 5.66E−08 |
| M2 | 1.08E+00 | 0.00E+00 | 1.98E−05 | 0.00E+00 | 1.98E−05 |
| M3 | 1.02E+00 | 0.00E+00 | 1.09E−08 | 0.00E+00 | 1.09E−08 |
| M4 | 9.79.E−01 | 0.00E+00 | 2.04E−07 | 0.00E+00 | 2.04E−07 |
| M5 | 1.10E+00 | 0.00E+00 | −1.68E−05 | 0.00E+00 | −1.68E−05 |
| M6 | 1.01E+00 | 0.00E+00 | −1.52E−07 | 0.00E+00 | −1.52E−07 |
| M7 | 1.00E+00 | 0.00E+00 | 8.58E−07 | 0.00E+00 | 8.58E−07 |
| M8 | 1.01E+00 | 0.00E+00 | 1.24E−07 | 0.00E+00 | 1.24E−07 |

Figure 4:
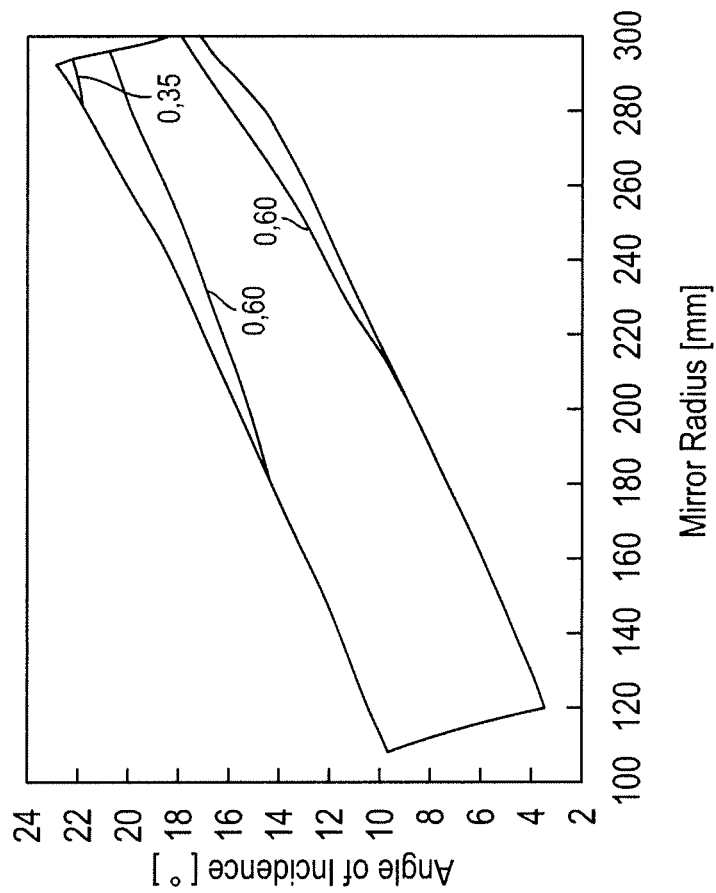
FIG. 4 shows the distribution of the radiation intensity as a function of the mirror radius and the incident angle for a mirror having a graded reflective coating, including a centered rotation-symmetrical coating thickness profile.

The distribution of the radiation intensity for mirror M7 of the comparative projection objective with centered rotation-symmetrical reflective coatings is shown in FIG. 4 in an analogous fashion to FIG. 3. It is obvious that the overall radiation intensity is lower and only exceeds 0.6, and the radiation intensity of much smaller mirror radii already falls below this value. With very high incident angles and a mirror radius of more than 280 mm, the intensity falls below even 0.35. While the maximum intensity reaches 0.7, as in the embodiment with decentered elliptical reflective coatings, the minimum value is no more than 0.25. The parameter space available for optimizing the mirror M7 within the projection objective, is therefore much smaller for a centered rotation-symmetrical reflective coating.

The intensity distribution was also examined in the pupil of both the projection objective shown in the FIG. 2 in an exemplary manner with graded reflective coatings with a decentered elliptic coating thickness profile, and of the comparative objective. For the projection objective with decentered elliptic reflective coatings, the mean intensity is 0.0378 at a field point in the center of the field, with a maximum value of 0.0403 and a minimum value of 0.0269. This is a substantial increase in intensity compared to the comparative projection objective with centered rotation-symmetrical reflective coatings, which has a mean intensity of 0.0316 at the same field point, with a maximum value of 0.0395 and a minimum value of 0.0098. The intensity distribution above the pupil not only leads to higher values overall with elliptic reflective coatings, which has a positive effect on the overall transmission of the projection objective, but the lower intensity variations also lead to an improvement in imaging performance.

The situation is similar for a field point on the periphery of the field. For the projection objective with decentered elliptic reflective coatings, the mean intensity is 0.0296, with a maximum value of 0.0390 and a minimum value of 0.0034. This is a substantial increase in intensity over the comparative projection objective with centered rotation-symmetrical reflective coatings, which has a mean intensity of 0.0277 at the same field point, with a maximum value of 0.0381 and a minimum value of 0.0066. At the periphery of the field, elliptical reflective coatings also lead to a higher intensity and thus higher overall transmission compared to rotation-symmetrical reflective coatings.

Figure 5:
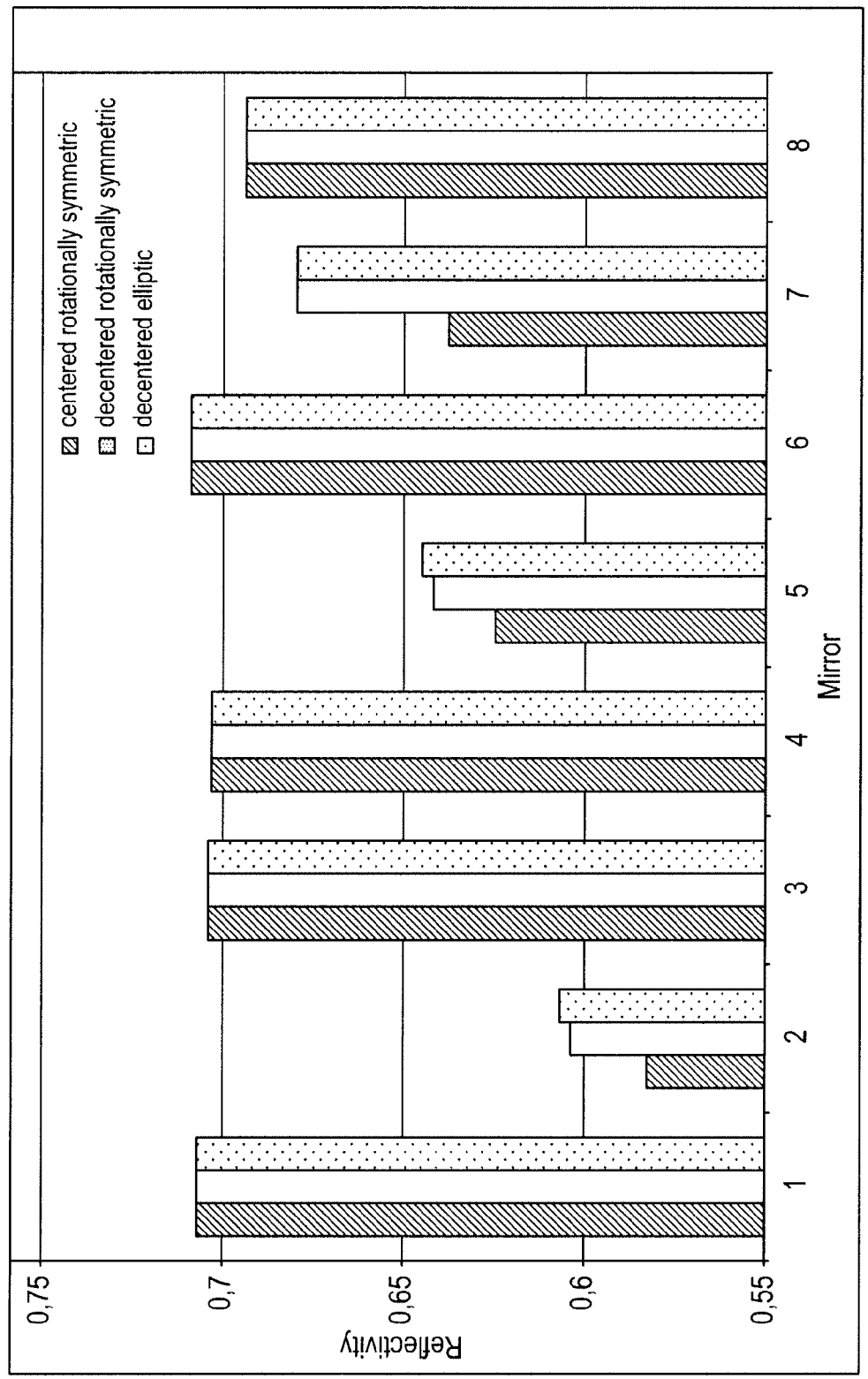
FIG. 5 is a comparison of the reflectivities of the mirrors of the projection objective shown in FIG. 1, on the one hand having an elliptic coating thickness profile and on the other hand having conventional coating thickness profiles.

FIG. 5 shows the reflectivities of the individual mirrors M1 to M8 for the projection objective shown in FIG. 2 with graded reflective coatings with a decentered elliptical coating thickness profile, as well as for the comparative projection objective with graded reflective coatings with a centered rotation-symmetrical coating thickness profile, as well as for a second comparative projection objective with graded reflective coatings with a decentered, rotation-symmetrical coating thickness profile. The coating thickness profile of the latter can also be described as $d(x,y)=c_1+c_6 x^2+c_7 x(y-c_3)+c_8 (y-c_3)^2$, wherein the coefficient $c_7$ is always equal to zero, and $c_6=c_8$. The values for the coefficients $c_1$, $c_3$, $c_6$, $c_7$, $c_8$, i.e. the development coefficients of a decentered, rotation-symmetrical coating, are shown in Table 4 for each mirror M1 to M8.

TABLE 4

|    | c1       | c3       | c6       | c7       | c8       |
|----|----------|----------|----------|----------|----------|
| M1 | 1.01E+00 | −2.48E+01 | 5.24E−08 | 0.00E+00 | 5.24E−08 |
| M2 | 1.07E+00 | −3.11E+01 | 1.01E−05 | 0.00E+00 | 1.01E−05 |
| M3 | 1.02E+00 | −1.03E+01 | 1.11E−08 | 0.00E+00 | 1.11E−08 |
| M4 | 9.79.E−01 | 3.14E+00 | 2.03E−07 | 0.00E+00 | 2.03E−07 |
| M5 | 1.12E+00 | 5.45E+01 | −6.86E−06 | 0.00E+00 | −6.86E−06 |
| M6 | 1.01E+00 | 4.24E−06 | −1.52E−07 | 0.00E+00 | −1.52E−07 |
| M7 | 9.96E−01 | 4.26E+01 | 8.37E−07 | 0.00E+00 | 8.37E−07 |
| M8 | 1.01E+00 | 2.11E−05 | 1.24E−07 | 0.00E+00 | 1.24E−07 |

As can be seen from the overview in FIG. 5, the configuration of the reflective coating as centered/rotation-symmetrical, decentered/rotation-symmetrical or decentered/elliptical has a particular effect on mirrors M2, M5 and M7, which are mirrors with a large incident angle range. Mirrors preferably have an incident angle range starting below 5° to 10° and reaching angles above 10° to 15°. For example, the incident angle range can be from about 1° to about 17°. The reflectivity of mirrors M2, M5 and M7 can be substantially increased by using a graded reflective coating with a decentered/elliptical or a decentered/rotation-symmetrical coating thickness profile instead of a graded reflective coating having a centered/rotation-symmetrical coating thickness profile.

It should be noted that a decentered/elliptical coating thickness profile allows mirrors M2 and M5, with otherwise identical conditions, to have a higher reflectivity than with a decentered/rotation-symmetrical coating thickness profile.

Since theoretically achievable reflectivities are not very high for objectives used in the EUV range, an effect that is compounded by the high number of mirrors, the overall transmission of the objectives is a critical quantity. Any reflectivity increase, tiny as it might be, is generally seen as an advantage in this context. The projection objectives presented here, having a plurality of mirrors, wherein at least one mirror has a graded reflective coating with an elliptical, parabolic or hyperbolic coating thickness profile, allow the reflectivity of each mirror to be substantially increased, which results in a higher overall transmission of the projection objective.

It should be noted that in the exemplary embodiment discussed here, and also the comparative examples, all mirrors have a graded reflective coating with a particular coating profile geometry. Mirrors with and without a graded reflective coating, or mirrors with graded reflective coatings, but each having different coating profile geometries, could also be provided in a projection objective. It should also be noted that an EUV projection objective need not have precisely eight mirrors, but could also have two, three, four, five, six, seven, or nine, ten or more mirrors.

Figure 6:
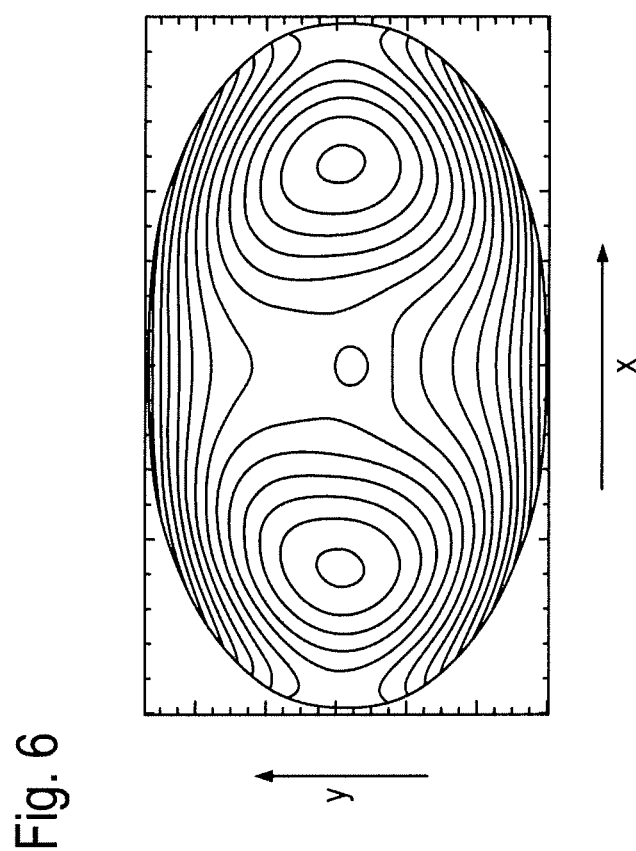
FIG. 6 shows the thickness profile in the mirror plane for an essentially hyperbolic coating thickness profile produced on a substrate with an essentially hyperbolic surface profile.

In a further example, a mirror for a projection objective was produced by coating a substrate having a rotationally-asymmetric surface profile using conventional coating devices. The surface profile in the mirror plane of the substrate can be described by $$O(x, y) = \sum_{i=0}^{n-1} \sum_{j=0}^{i} c_{\Sigma_{k=1}^i k+j+1} x^{i-j} y^j = c_1 + c_2 x + c_3 y + c_4 x^2 + \ldots$$

with n=13 and the coefficients d1 to d91 in mm as listed in table 5. The coating devices worked as usual in a rotationally-symmetric way, wherein the rotationally-symmetry is adjustable at will by using diaphragms. The resulting coating thickness profile in mirror plane of the graded coating can be described by $$d(x, y) = \sum_{i=0}^{n-1} \sum_{j=0}^{i} a_{\Sigma_{k=1}^i k+j+1} x^{i-j} (y - 13.194)^j$$

with n=8 and the coefficients a1 to a36 in mm as listed in table 5 and is illustrated in FIG. 6 as contour plot. Coefficient b1 was chosen to be 0 and b2 was chosen to be 13.194 mm to minimize the rotational-asymmetry, and during the coating diaphragms were used to minimize the rotational-symmetry. Considering the first coefficients of $O(x,y)$ it can be understood that the surface profile of the substrate is essentially hyperbolic. Considering in particular the six first coefficients of $d(x,y)$ a1 to a6 and comparing them to the following coefficients, it can be understood that the thickness profile is constant in zero order approximation and hyperbolic in first order approximation, while the coefficients a7 to a36 that contribute to the deviation from the perfect hyperbolic form are several orders of magnitude smaller than the coefficients a1 to a6.

As for the elliptical coating thickness profile in the mirror plane described before, this essentially hyperbolic coating thickness profile in the mirror plane can be useful to improve e.g. the transmission of a projection objective in which a mirror having such a graded coating is utilized, in particular if the coating is decentered with respect to the optical axis of the projection objective. A projection objective may have more than one such mirror. Various mirrors having discretionary non rotationally-symmetric coating thickness profiles in the mirror plane, such as inter alia essentially elliptic thickness profiles, essentially parabolic thickness profiles or essentially hyperbolic thickness profiles, may be combined in one projection objective.

TABLE 5

| Surface profile | | Coating thickness profile | |
|---|---|---|---|
| C1 | 0 | a1 | 0.99903314 |
| C2 | 0 | a2 | 1.01E−08 |
| C3 | −4.36E−02 | a3 | 4.45E−05 |
| C4 | 5.74E−04 | a4 | 5.24E−06 |
| C5 | 0 | a5 | −1.19E−08 |
| C6 | 2.54E−03 | a6 | −1.59E−06 |
| C7 | 0 | a7 | 2.03E−10 |
| C8 | −3.34E−07 | a8 | 9.64E−09 |
| C9 | 0 | a9 | 4.90E−10 |
| C10 | −8.83E−07 | a10 | 1.72E−08 |
| C11 | 1.75E−09 | a11 | −8.93E−10 |
| C12 | 0 | a12 | 4.08E−12 |
| C13 | 7.86E−09 | a13 | −1.19E−09 |
| C14 | 0 | a14 | 1.26E−11 |
| C15 | 1.13E−08 | a15 | 1.52E−12 |
| C16 | 0 | a16 | −4.19E−14 |
| C17 | −1.55E−12 | a17 | −2.03E−12 |
| C18 | 0 | a18 | −2.27E−13 |
| C19 | −1.53E−11 | a19 | −7.44E−12 |
| C20 | 0 | a20 | −3.01E−13 |
| C21 | −1.78E−11 | a21 | −7.03E−12 |
| C22 | 8.98E−15 | a22 | 3.96E−14 |
| C23 | 0 | a23 | −3.04E−16 |
| C24 | 6.67E−14 | a24 | 6.63E−14 |
| C25 | 0 | a25 | −2.00E−15 |
| C26 | 1.94E−13 | a26 | −5.13E−14 |
| C27 | 0 | a27 | −2.85E−15 |
| C28 | 3.05E−14 | a28 | −1.10E−13 |
| C29 | 0 | a29 | 2.44E−18 |
| C30 | −2.34E−17 | a30 | 1.28E−16 |
| C31 | 0 | a31 | 2.11E−17 |
| C32 | −2.15E−16 | a32 | 7.77E−16 |
| C33 | 0 | a33 | 5.82E−17 |
| C34 | −5.34E−17 | a34 | 1.59E−15 |
| C35 | 0 | a35 | 5.62E−17 |
| C36 | −2.51E−17 | a36 | 1.14E−15 |
| C37 | 6.08E−20 | | |
| C38 | 0 | | |
| C39 | 7.69E−19 | | |
| C40 | 0 | | |
| C41 | 2.82E−18 | | |
| C42 | 0 | | |
| C43 | 2.27E−18 | | |
| C44 | 0 | | |
| C45 | 2.37E−17 | | |
| C46 | 0 | | |
| C47 | 1.32E−23 | | |
| C48 | 0 | | |
| C49 | −6.76E−21 | | |
| C50 | 0 | | |
| C51 | −1.78E−20 | | |
| C52 | 0 | | |
| C53 | −1.16E−19 | | |

TABLE 5-continued

| Surface profile | | Coating thickness profile |
|---|---|---|
| C54 | 0 | |
| C55 | −1.16E−19 | |
| C56 | 8.52E−25 | |
| C57 | 0 | |
| C58 | 7.16E−24 | |
| C59 | 0 | |
| C60 | 5.98E−23 | |
| C61 | 0 | |
| C62 | 3.54E−22 | |
| C63 | 0 | |
| C64 | 1.42E−21 | |
| C65 | 0 | |
| C66 | 1.32E−22 | |
| C67 | 0 | |
| C68 | −2.32E−27 | |
| C69 | 0 | |
| C70 | 1.54E−25 | |
| C71 | 0 | |
| C72 | 9.59E−25 | |
| C73 | 0 | |
| C74 | −2.94E−24 | |
| C75 | 0 | |
| C76 | −1.21E−24 | |
| C77 | 0 | |
| C78 | −1.05E−23 | |
| C79 | −1.23E−29 | |
| C80 | 0 | |
| C81 | −1.42E−28 | |
| C82 | 0 | |
| C83 | −2.36E−27 | |
| C84 | 0 | |
| C85 | −8.24E−27 | |
| C86 | 0 | |
| C87 | 1.55E−26 | |
| C88 | 0 | |
| C89 | −1.63E−26 | |
| C90 | 0 | |
| C91 | 6.49E−26 | |

What is claimed is:

1. A projection objective configured to image a pattern in an object plane into an image plane along a radiation path, the projection objective comprising:

a plurality of mirrors between the object plane and the image plane, the plurality of mirrors being configured so that, during use of the projection objective, each of the plurality of mirrors is irradiated at an incident angle range characteristic for the mirror, wherein:

a mirror of the plurality of mirrors has a largest incident angle range;

the mirror having the largest incident angle range comprises a graded reflective coating supported and a substrate which supports the graded reflective coating;

the graded reflective coating has a contour line defining a constant thickness of the graded reflective coating in a mirror plane parallel to the image plane;

the contour line is elliptical with unequal major and minor axes, parabolic or hyperbolic; and the projection objective is configured to be used with EUV radiation.

2. The projection objective of claim 1, wherein the projection objective is a microlithography projection objective.

3. The projection objective of claim 1, wherein a thickness profile d(x,y) of the graded reflective coating in the mirror plane having coordinates x and y is $$d(x, y) = \sum_{i=0}^{n-1} \sum_{j=0}^{i} a_{\sum_{k=1}^{i} k+j+1}(x - b_1)^{i-j}(y - b_2)^j$$

with n the maximum degree of the polynomial and $$a_{\sum_{k=1}^{i} k+j+1},$$

b1, b2 coefficients.

4. The projection objective of claim 3, wherein the coefficient b1 or b2 is not equal to zero.

5. The projection objective of claim 1, wherein a surface profile O(x,y) of the substrate in the mirror plane having coordinates x and y is $$O(x, y) = \sum_{i=0}^{n-1} \sum_{j=0}^{i} c_{\sum_{k=1}^{i} k+j+1} x^{i-j} y^j = c_1 + c_2 x + c_3 y + c_4 x^2 + \ldots$$

with n the maximum degree of the polynomial and $$d_{\sum_{k=1}^{i} k+j+1}$$

coefficients.

6. The projection objective of claim 1, wherein the substrate has a rotationally-asymmetric profile.

7. The projection objective of claim 1, wherein the substrate has a rotationally-symmetric surface profile.

8. The projection objective of claim 1, wherein a surface profile of the substrate is essentially hyperbolic.

9. The projection objective of claim 8, wherein the contour line is essentially hyperbolic.

10. The projection objective of claim 1, wherein the contour line is essentially hyperbolic.

11. The projection objective of claim 1, wherein the plurality of mirrors comprises more than five mirrors.

12. The projection objective of claim 1, wherein all the mirrors have a coaxial arrangement with respect to each other.

13. The projection objective of claim 1, wherein the plurality of mirrors is configured so that, during use of the projection objective, an intermediate image is created between the object plane and the image plane.

14. The projection objective of claim 1, wherein the contour line is elliptical with unequal major and minor axes.

15. The projection objective of claim 1, wherein the contour line is parabolic.

16. A system, comprising:
a projection objective configured to image a pattern in an object plane into an image plane along a radiation path, the projection objective comprising:
a plurality of mirrors between the object plane and the image plane, the plurality of mirrors being configured so that, during use of the projection objective, each of the plurality of mirrors is irradiated at an incident angle range characteristic for the mirror, wherein:
a mirror of the plurality of mirrors has a largest incident angle range;
the mirror having the largest incident angle range comprises a graded reflective coating supported and a substrate which supports the graded reflective coating;
the graded reflective coating has a contour line defining a constant thickness of the graded reflective coating in a mirror plane parallel to the image plane;
the contour line is elliptical with unequal major and minor axes, parabolic or hyperbolic; and
the system is an EUV microlithography projection illumination system.

17. The system of claim 16, wherein the contour line is elliptical with unequal major and minor axes.

18. The system of claim 16, wherein the contour line is parabolic.

19. The system of claim 16, wherein the contour line is hyperbolic.

20. A projection objective configured to image a pattern in an object plane into an image plane along a radiation path, the projection objective comprising:
a mirror between the object plane and the image plane along the radiation path,
wherein:
the mirror has a mirror plane parallel to the image plane;
the mirror comprises a graded reflective coating that has a contour line defining a constant thickness of the graded reflective coating in the mirror plane;
the contour line is elliptical with unequal major and minor axes, parabolic or hyperbolic; and
the projection objective is configured to be used with EUV radiation.

21. The projection objective of claim 20, wherein the projection objective is a microlithography projection objective.

22. The projection objective of claim 20, wherein the projection objective comprises a plurality of mirrors between the object plane and the image plane.

23. The projection objective of claim 22, wherein the plurality of mirrors define an optical axis of the projection objective, and a coating axis of the graded reflective coating of the mirror is arranged eccentrically with respect to the optical axis of the projection objective.

24. The projection objective of claim 22, wherein the graded reflective coating of the mirror has an elliptical profile of a thickness d in the mirror plane having coordinates x and y, wherein d is described by the equation:

$$d(x, y) = c_1 + \begin{pmatrix} x - c_2 \\ y - c_3 \end{pmatrix}^T \begin{pmatrix} c_6 & c_7/2 \\ c_7/2 & c_8 \end{pmatrix} \begin{pmatrix} x - c_2 \\ y - c_3 \end{pmatrix},$$

wherein $c_1, c_2, c_3, c_6, c_7, c_8$ are coefficients.

25. A system comprising:
the projection objective of claim 20,
wherein the system is an EUV microlithography projection illumination system.

26. The projection objective of claim 20, wherein the contour line is elliptical with unequal major and minor axes.

27. The projection objective of claim 20, wherein the contour line is parabolic.

28. The projection objective of claim 20, wherein the contour line is hyperbolic.

* * * * *

UNITED STATES PATENT AND TRADEMARK OFFICE
CERTIFICATE OF CORRECTION

PATENT NO. : 8,902,406 B2  Page 1 of 1
APPLICATION NO. : 12/951216
DATED : December 2, 2014
INVENTOR(S) : Reinhold Walser et al.

It is certified that error appears in the above-identified patent and that said Letters Patent is hereby corrected as shown below:

In The Specification

Col. 2, line 46, delete " $d_{\Sigma_{k=1}^{i} k+j+1}$ " and insert -- $\sum_{k=1}^{c_i} k+j+1$ --.

Signed and Sealed this
Twenty-third Day of June, 2015

Michelle K. Lee
*Director of the United States Patent and Trademark Office*